US008325451B2

(12) United States Patent
Mitsuda

(10) Patent No.: US 8,325,451 B2
(45) Date of Patent: Dec. 4, 2012

(54) POWER SWITCHING CIRCUIT

(75) Inventor: Tsuyoshi Mitsuda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 669 days.

(21) Appl. No.: 12/379,730

(22) Filed: Feb. 27, 2009

(65) Prior Publication Data
US 2009/0219661 A1 Sep. 3, 2009

(30) Foreign Application Priority Data

Mar. 3, 2008 (JP) ................................. 2008-052347

(51) Int. Cl.
H02H 3/08 (2006.01)
H02H 9/02 (2006.01)
(52) U.S. Cl. ...................................... 361/93.1; 361/93.9
(58) Field of Classification Search ................ 361/93.1, 361/93.9; 323/277
See application file for complete search history.

(56) References Cited

U.S. PATENT DOCUMENTS

| 5,422,593 | A | * | 6/1995 | Fujihira ......................... 327/561 |
| 5,473,276 | A | * | 12/1995 | Throngnumchai ............ 327/432 |
| 5,642,252 | A | * | 6/1997 | Sakamoto et al. ............ 361/93.9 |
| 5,684,662 | A | | 11/1997 | Jo et al. |
| 5,815,027 | A | | 9/1998 | Tihanyi et al. |
| 5,903,422 | A | * | 5/1999 | Hosokawa .................... 361/93.1 |
| 6,101,106 | A | * | 8/2000 | Shi .................................. 363/41 |
| 6,140,806 | A | * | 10/2000 | Gohara ......................... 323/282 |
| 6,201,674 | B1 | * | 3/2001 | Warita et al. .................... 361/18 |
| 6,438,003 | B1 | * | 8/2002 | Balakrishnan et al. ......... 363/50 |
| 6,559,684 | B2 | * | 5/2003 | Goodfellow et al. ............ 327/53 |
| 6,577,511 | B2 | * | 6/2003 | Yamaguchi et al. ....... 363/21.07 |
| 6,717,785 | B2 | * | 4/2004 | Fukuda et al. ............... 361/93.1 |
| 6,842,064 | B2 | * | 1/2005 | Yamamoto .................... 327/480 |
| 7,359,171 | B2 | * | 4/2008 | Yoshida ...................... 361/93.9 |
| 7,457,089 | B2 | | 11/2008 | Ohshima |
| 7,626,792 | B2 | * | 12/2009 | Mitsuda ...................... 361/93.1 |
| 7,675,725 | B2 | * | 3/2010 | Matsuda ........................ 361/90 |
| 2007/0030615 | A1 | * | 2/2007 | Ishikawa et al. .............. 361/100 |
| 2008/0112103 | A1 | * | 5/2008 | Matsuda ........................ 361/90 |
| 2009/0273874 | A1 | * | 11/2009 | Yen .............................. 361/93.9 |
| 2010/0117608 | A1 | * | 5/2010 | Tseng ........................... 323/272 |

FOREIGN PATENT DOCUMENTS

| JP | 08-222921 | 8/1996 |
| JP | 08-334534 | 12/1996 |
| JP | 2007-134780 A | 5/2007 |

* cited by examiner

Primary Examiner — Rexford Barnie
Assistant Examiner — Christopher Clark
(74) Attorney, Agent, or Firm — Foley & Lardner LLP

(57) ABSTRACT

A power switching circuit according to an exemplary embodiment of the present invention includes an output transistor connected between a power supply terminal VCC and an output terminal OUT, an output controller which controls a conducting state of the output transistor according to an input signal, a sense transistor having a gate commonly connected with the output transistor, which detects an output current flowing into the output transistor, an output current detection terminal in which a detection voltage is generated according to the output current detected by the sense transistor and a short circuit detector which detects a short circuit condition of the output current detection terminal according to the detection voltage and stops the output transistor or limits the output current.

16 Claims, 10 Drawing Sheets

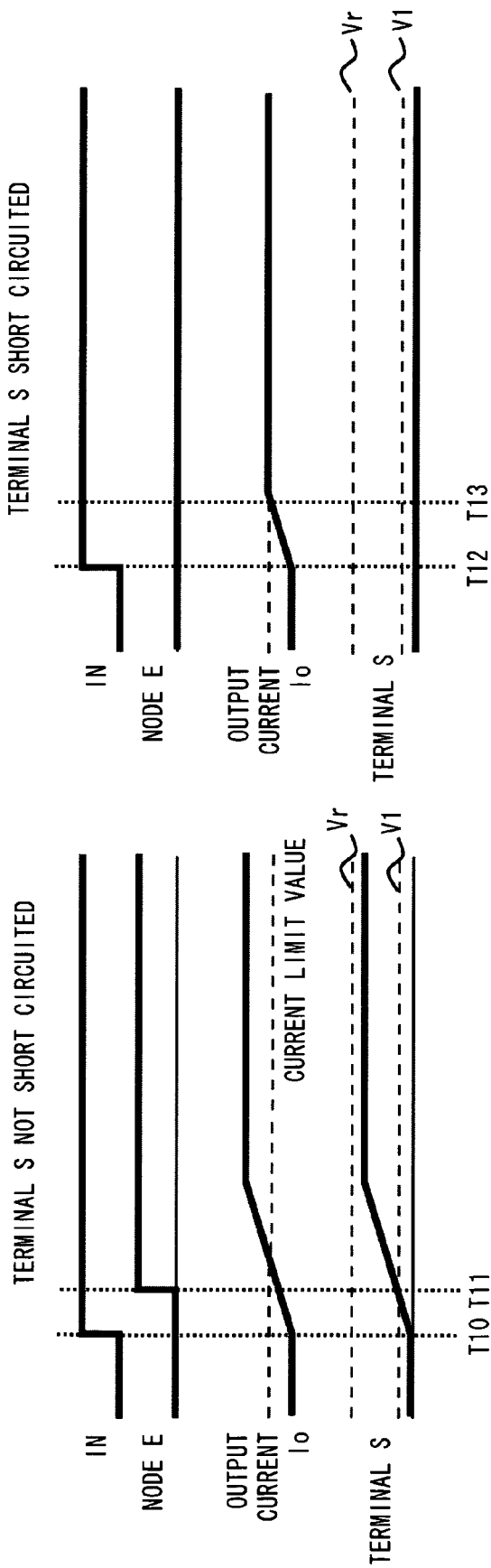

Fig. 9

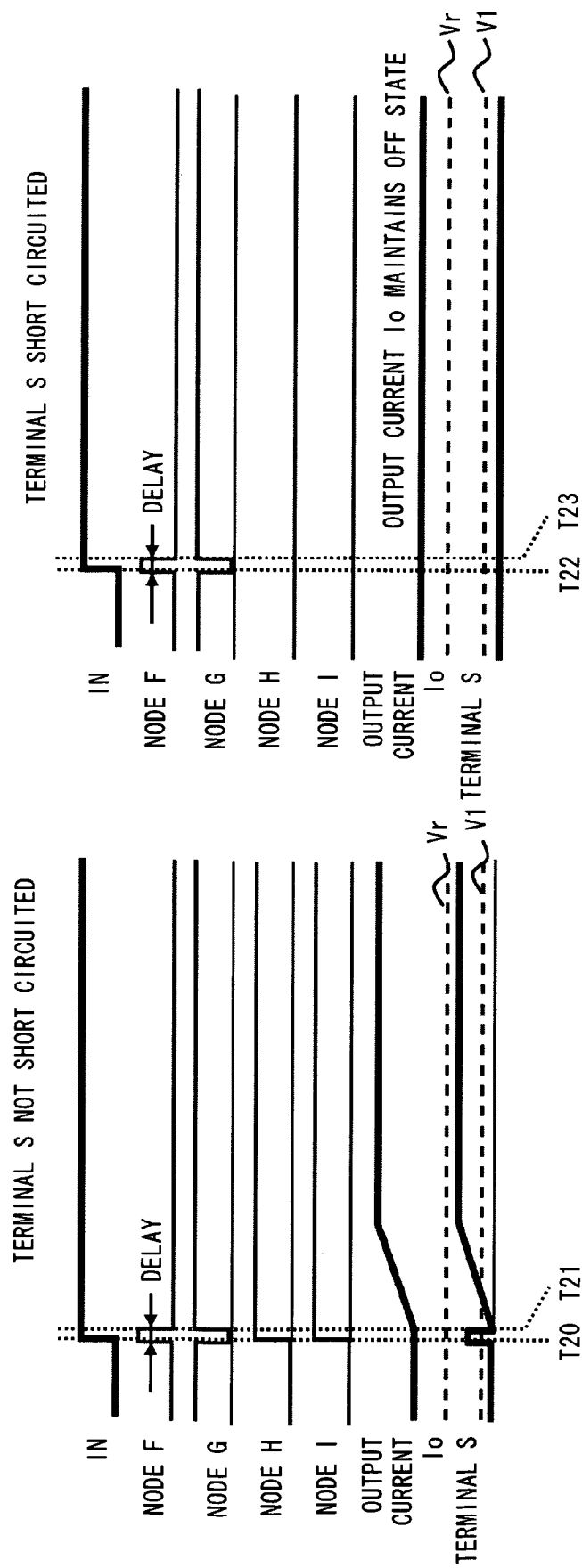

POWER SWITCHING CIRCUIT

BACKGROUND

1. Field of the Invention

The present invention relates to a power switching circuit including an output current detection terminal for detecting an output current that flows into an output transistor.

2. Description of Related Art

Power supply switching circuits mounted between a power supply and a load circuit are often used for controlling a current flowing from the power supply into the load circuit in order to reduce the power consumption of the system. In a power switching circuit, generally an output transistor is connected between a power supply and a load circuit. Then, by operating the output transistor as a switch, the current flowing from the power supply into the load circuit is controlled.

In such a power switching circuit, if an overcurrent flows into the output transistor due to a defect in the load circuit, a protection system is mounted for detecting the current and reducing or blocking an output current so as to protect the power switch circuit. The amount of the output current is firstly detected in such a protection system. An example of this output current detection method is disclosed in Japanese Unexamined Patent Application Publication No. 8-334534.

In Japanese Unexamined Patent Application Publication No. 8-334534, an output transistor is connected with a sense transistor in a mirror configuration, which has a similar configuration to the output transistor. Then, a current (sense current) proportional to an output current is obtained using the sense transistor to output to an external resistor (current sense resistor). In Japanese Unexamined Patent Application Publication No. 8-334534, by monitoring a detection voltage generated by the sense current and the current sense resistor, an overcurrent flowing into the output transistor is detected. Moreover, Japanese Unexamined Patent Application Publication No. 8-334534 discloses an amplifier which monitors a voltage of an output terminal and reflects the monitored voltage to a current output terminal of the sense transistor. The amplifier enables to have the same voltage in current output terminals (sources) of the output transistor and the sense transistor. Thus this improves the accuracy of the ratio of the sense current which is output from the sense transistor and an output current which is output from the output transistor.

Furthermore, when detecting an overcurrent flowing into the output transistor, the protection system needs to block the output transistor or reduce the output current. Such a control method of the output transistor is disclosed in Japanese Unexamined Patent Application Publication No. 8-222921. In Japanese Unexamined Patent Application Publication No. 8-222921, a current protector compares a reference voltage Vr with a voltage of an output terminal and detects an overcurrent according to the comparison result. Moreover, in Japanese Unexamined Patent Application Publication No. 8-222921, in case of detecting an overcurrent, after blocking an output transistor for a predetermined period using a latch and a timer circuits, the output transistor is operated again.

A power switching circuit 100 shown in FIG. 12 may be considered by combining the above Japanese Unexamined Patent Application Publication No. 8-334534 and Japanese Unexamined Patent Application Publication No. 8-222921. In the power switching circuit 100, an output controller 110 controls the conducting state of an output transistor OTr according to an output signal input from an input terminal IN. This drives a load RL which is connected to an output terminal.

Moreover, in the power switching circuit 100, a sense transistor STr which is connected with the output transistor OTr in a mirror configuration generates a sense current corresponding to an output current. Then, by passing the sense current to the current sense resistor RS, a detection voltage is generated in the output current detection terminal S. At this time, in the power switching circuit 100, a voltage of a current output terminal (source) of the sense transistor STr and a voltage of a current output terminal (source) of the output transistor OTr are made to be almost the same by an amplifier 111 and a transistor Tr1. This improves the accuracy of the ratio of the sense current and the output current.

Moreover, in the power switching circuit 100, the overcurrent detector 112 monitors the detection voltage generated in the output current detection terminal S so as to detect the overcurrent condition of the output transistor. In the overcurrent detector 112, a comparator 113 compares a reference voltage Vr with the detection voltage. If the detection voltage exceeds the reference voltage Vr, the overcurrent detector 112 outputs an overcurrent detection signal. This overcurrent detection signal is held for a certain period in a latch circuit 114 and a timer 115. Moreover, an inverter 116 is provided in order to ensure the compatibility of the logic of the overcurrent detection signal in the output controller 110.

Then, the power switching circuit 100 cuts off the output transistor OTr irrespective of the value of an input signal while the overcurrent detection signal indicates the overcurrent condition. The timing chart showing the operation of this power switching circuit 100 is shown in FIG. 13.

As shown in FIG. 13, in the power switching circuit 100, an output current Io increases in response to a rising edge of an input signal at the timing T101. Moreover, the detection voltage of the output current detection terminal S also increases with the increase of the output current Io. The timing chart shown in FIG. 13 shows no overcurrent condition.

On the other hand, the timing chart of the power switching circuit 100 when detecting an overcurrent is shown in FIG. 14. As shown in FIG. 14, at the timing T102, the output current Io increases in response to a rising edge of an input signal. Moreover, the detection voltage of the output current detection terminal S also increases with the increase of the output current Io. Then, if an overcurrent is generated at the timing T103 and the voltage of the output current detection terminal S reaches the reference voltage Vr, the overcurrent detector 112 detects an overcurrent condition and stops the output transistor OTr. After a certain period (OFF period in FIG. 14) by a timer, the power switching circuit 100 starts operating again at the timing T104 and the output current Io increases. If an overcurrent condition is generated again according to the state of the load RL at this time, the output transistor OTr stops at the timing T105 in the same way as the timing T103.

SUMMARY

However and the present inventor has found the following problem. If the output current detection terminal S is short circuited, the detection voltage does not increase even when an overcurrent is generated, thereby disabling the overcurrent detector 112 to detect an overcurrent. That is, when using the techniques disclosed in Japanese Unexamined Patent Application Publication No. 8-334534 and Japanese Unexamined Patent Application Publication No. 8-222921, if the output current detection terminal S is short circuited, it is not possible to protect the power switching circuit 100 from an overcurrent condition.

An exemplary aspect of an embodiment of the present invention is a power switching circuit that includes an output transistor connected between a power supply terminal and an output terminal, an output controller which controls a conducting state of the output transistor according to an input signal, a sense transistor having a gate commonly connected to the output transistor, which detects an output current flowing into the output transistor, an output current detection terminal in which a detection voltage corresponding to the output current is generated, where the detection voltage being detected by the sense transistor and a short circuit detector which detects a short circuit condition of the output current detection terminal according to the detection voltage and outputs a short circuit control signal for stopping the output transistor or limiting the output current.

The power switching circuit according to an exemplary embodiment of the present invention includes a short circuit detector which detects a short circuit condition of the output current detection terminal and outputs a short circuit control signal for stopping the output transistor or limiting the current output. This enables to accurately avoid the situation in which an overcurrent flows into the output transistor even when the output current detection terminal is short circuited.

With the power switching circuit according to an exemplary embodiment of the present invention, even if the output current detection terminal is short circuited, it is possible to prevent an overcurrent from flowing into the output transistor and destroying the power switching circuit.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 7 is a timing chart showing a normal operation in the power switching circuit according to the second exemplary embodiment of the present invention;

FIG. 8 is a timing chart showing an abnormal operation in the power switching circuit according to the second exemplary embodiment of the present invention;

FIG. 9 is a detailed block diagram of the power switching circuit according to a third exemplary embodiment of the present invention;

FIG. 10 is a timing chart showing a normal operation in the power switching circuit according to the third exemplary embodiment of the present invention;

FIG. 11 is a timing chart showing an abnormal operation in the power switching circuit according to the third exemplary embodiment of the present invention;

DETAILED DESCRIPTION OF THE EXEMPLARY EMBODIMENTS

First Exemplary Embodiment

Figure 1:
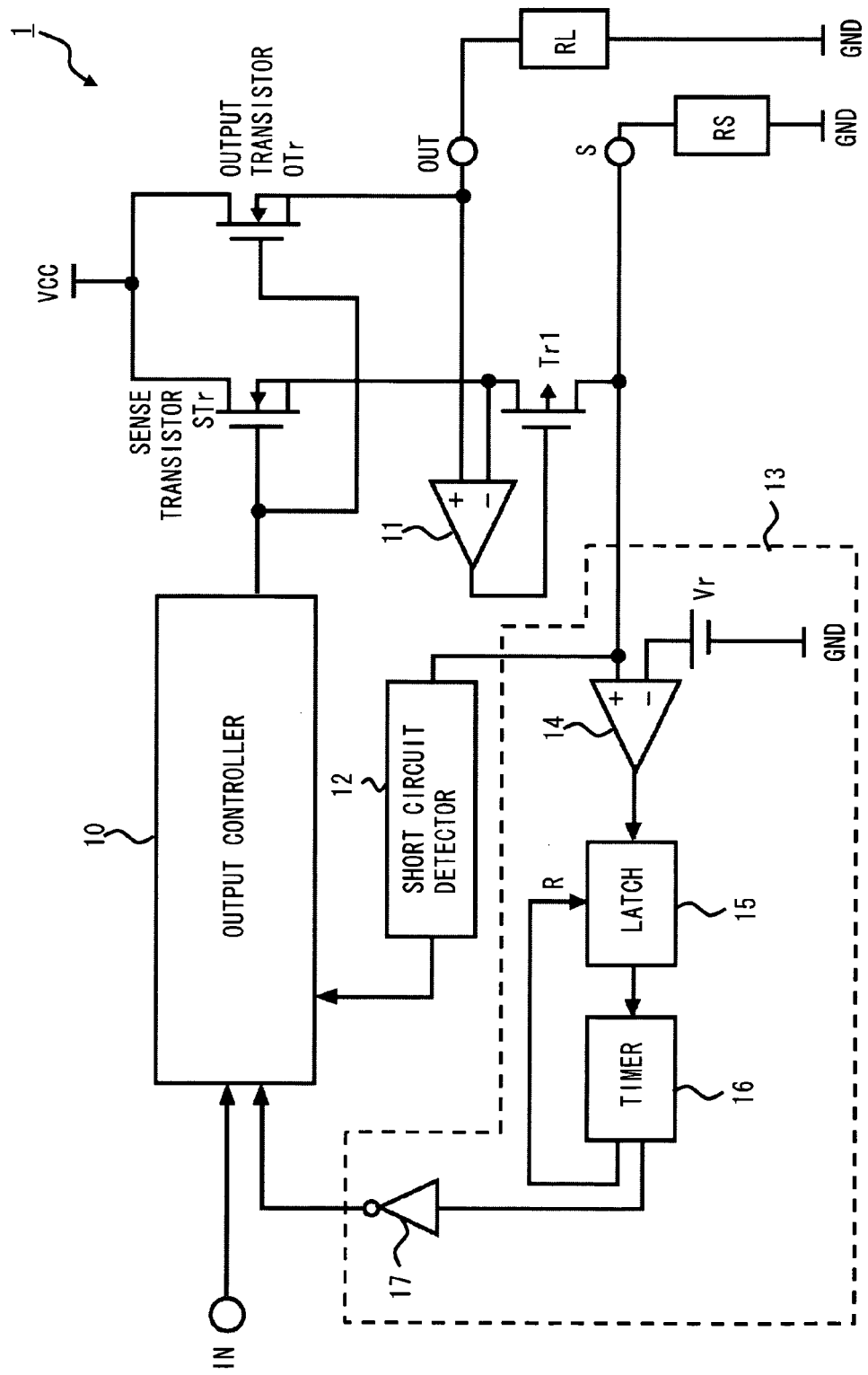
FIG. 1 is a block diagram of a power switching circuit according to a first exemplary embodiment of the present invention.

An exemplary embodiment of the present invention is described hereinafter with reference to the drawings. The block diagram of a power switching circuit 1 according to this embodiment is shown in FIG. 1. As shown in FIG. 1, the power switching circuit 1 includes an output controller 10, an amplifier 11, a short circuit detector 12, an overcurrent detector 13, a transistor Tr1, a sense transistor STr, an output transistor OTr, an input terminal IN, an output terminal OUT and an output current detection terminal S. Moreover, a load RL, which is a load circuit, is connected between the output terminal OUT and a ground terminal GND. A current sense resistor RS is connected between the output current detection terminal S and the ground terminal GND.

The output controller 10 outputs an output control signal which controls the conducting state of the output transistor OTr according to an input signal input via the input terminal IN. Moreover, when receiving an overcurrent detection signal from the overcurrent detector 13, the output controller 10 turns off the output transistor OTr regardless of the input signal. Furthermore, when receiving a short circuit detection signal from the short circuit detector 12, the output controller 10 turns off the output transistor or limits an output current.

In this embodiment, an NMOS transistor is used for the output transistor OTr. As for the output transistor OTr, a drain is connected to a power supply terminal VCC, a current output terminal (for example, a source) is connected to the output terminal OUT and a gate is connected to the output of the output controller 10. In this embodiment, an NMOS transistor is used for the sense transistor STr. As for the sense transistor STr, a drain is connected to the power supply terminal VCC and a source is connected to a source of the transistor Tr1. That is, the sense transistor STr is connected with the output transistor OTr in a mirror configuration. In this embodiment, the configuration of the sense transistor STr is similar to the output transistor with a smaller transistor size than the output transistor OTr. The sense transistor STr outputs a sense current that is proportional to the output current flowing into the output transistor OTr. This sense current is provided to the current sense resistor RS which is connected to the output current detection terminal S. Accordingly, the voltage difference (the voltage of the output current detection terminal S) between both ends of the current sense resistor RS becomes proportional to the output current. The voltage generated in the output current detection terminal S is hereinafter referred to as a detection voltage.

As for the amplifier 11, a non-inverting terminal is connected to the output terminal OUT, an inverting terminal is connected to a source of the transistor Tr1 and an output terminal is connected to a gate of the transistor Tr1. The amplifier 11 monitors an output voltage generated in the output terminal OUT to control the conducting state of the transistor Tr1. Thus the voltage of the source of the sense transistor STr becomes almost the same as the output voltage. This enables to improve the accuracy of the ratio of the sense current detected by the sense transistor STr and the output current flowing into the output transistor OTr. It is noted that the drain of the transistor Tr1 is connected to the output current detection terminal S.

The short circuit detector 12 detects a short circuit condition in the output current detection terminal S according to the detection voltage generated in the output current detection terminal S and outputs a short circuit control signal. The output transistor OTr is stopped or its output current is limited by the short circuit control signal.

The overcurrent detector 13 detects that an overcurrent has flowed into the output transistor OTr according to the detection voltage generated in the output current detection terminal S and outputs an overcurrent detection signal. The output transistor OTr is stopped or the output current is limited by the overcurrent detection signal.

The overcurrent detector 13 includes a comparator 14, a latch circuit 15, a timer 16, an inverter 17 and a first reference voltage source Vr. As for the comparator 14, a non-inverting terminal is connected to the output current detection terminal S, an inverting terminal is connected to the first reference voltage source Vr and an output terminal is connected to the latch circuit 15. The first reference voltage source Vr is connected between the inverting terminal of the comparator 14 and the ground terminal GND. The reference voltage generated by the first reference voltage Vr is hereinafter referred to as a reference voltage Vr.

The latch circuit 15 holds the comparison result of the detection voltage and the reference voltage Vr by the comparator 14. For example, at a timing when the comparison result switches from a low level to a high level, the latch circuit 15 changes an output signal from a low level to a high level. On the other hand, when a reset signal R is output from the timer, the latch circuit 15 changes the output signal from the high level to the low level.

The timer 16 counts for a predetermined period for example from when the output signal from the latch circuit 15 changes to the high level and outputs the reset signal R. Moreover, the timer 16 outputs the output signal of the latch circuit 15 as an overcurrent detection signal. The overcurrent detection signal is inverted by the inverter 17 and input into the output controller 10. It is noted that the inverter 17 is provided in order to ensure the compatibility of the logic of the overcurrent detection signal in the output controller 10.

Figure 2:
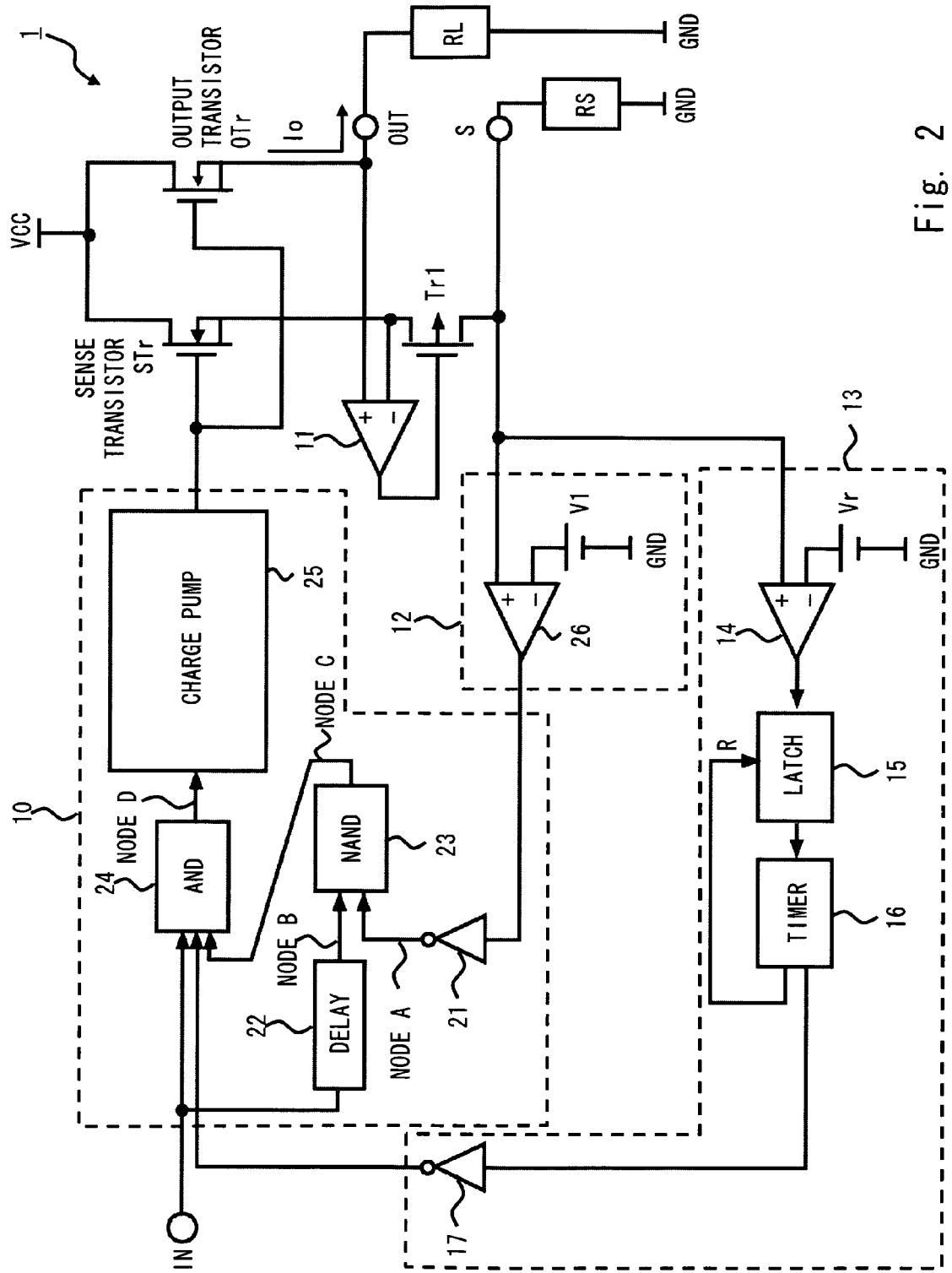
FIG. 2 is a detailed block diagram of the power switching circuit according to the first exemplary embodiment of the present invention.

The details of the output controller 10 and the short circuit detector 12 in this embodiment are explained hereinafter. The block diagram of the power switching circuit 1 including the detailed block diagram of the output controller 10 and the short circuit detector 12 of the power switching circuit 1 shown in FIG. 1 is shown in FIG. 2. It is noted that the output controller 10 and the short circuit detector 12 can be realized by other embodiments, which are explained later. Moreover, blocks other than the output controller 10 and the short circuit detector 12 are same as those explained with reference to FIG. 1. Thus the explanation is not repeated in the following explanation. As shown in FIG. 2, the output controller 10 in this embodiment includes an inverter 21, a delay circuit 22, a NAND circuit 23, an AND circuit 24 and a charge pump circuit 25.

The inverter 21 inverts a short circuit control signal output by the short circuit detector 12 and outputs it to the NAND circuit 23. The path from the inverter 21 to the NAND circuit 23 is referred to as a node A. The delay circuit 22 delays an input signal input from the input terminal IN and outputs it. The path from the delay circuit 22 to the NAND circuit 23 is referred to as a node B. The NAND circuit 23 outputs a NAND operation result of a short circuit control signal which is input via the inverter 21 and an input signal which is input via the delay circuit 22 to the AND circuit 24 as an evaluation signal. The path from the NAND circuit 23 to the AND circuit 24 is referred to as a node C.

The AND circuit 24 outputs an AND operation result of the input signal which is input from the input terminal IN, the overcurrent detection signal which is output by the overcurrent detector 13 and an evaluation signal input via the node C to the charge pump circuit 25 as an enable signal. The path from the AND circuit 24 to the charge pump circuit 25 is referred to as a node D. If the enable signal input via the node D is enabled (for example, high-level), the charge pump circuit 25 outputs a boosted voltage to the output transistor OTr as an output control signal. Then the charge pump circuit 25 turns on the output transistor OTr. On the other hand, if the enable signal is disenabled (for example, low level), the charge pump circuit 25 stops the operation, outputs the ground potential to the output transistor OTr as an output control signal and then turns off the output transistor OTr.

The short circuit detector 12 in this embodiment includes a comparator 26 and a second reference voltage source V1. As for the comparator 26, a non-inverting terminal is connected to the output current detection terminal S and an inverting terminal is connected to the second reference voltage source V1. The second reference voltage source V1 is connected between the ground terminal GND and the inverting terminal of the comparator 26. The reference voltage generated by the second reference voltage V1 is hereinafter referred to as a reference voltage V1. The comparator 26 outputs the comparison result of the reference voltage V1 and the detection voltage generated in the output current detection terminal S as the short circuit control signal. If the detection voltage is lower than the reference voltage V1, the short circuit control signal becomes a low level if the detection voltage is higher than the reference voltage V1, the short circuit control signal becomes a high level. It is noted that a voltage lower than the reference voltage Vr is set to the reference voltage V1.

Next, the operation of the power switching circuit 1 is explained. Firstly, FIG. 3 shows the timing chart illustrating an operation when the output current detection terminal S is not short circuited (normal condition) in the power switching circuit 1.

Figures 3, 4:
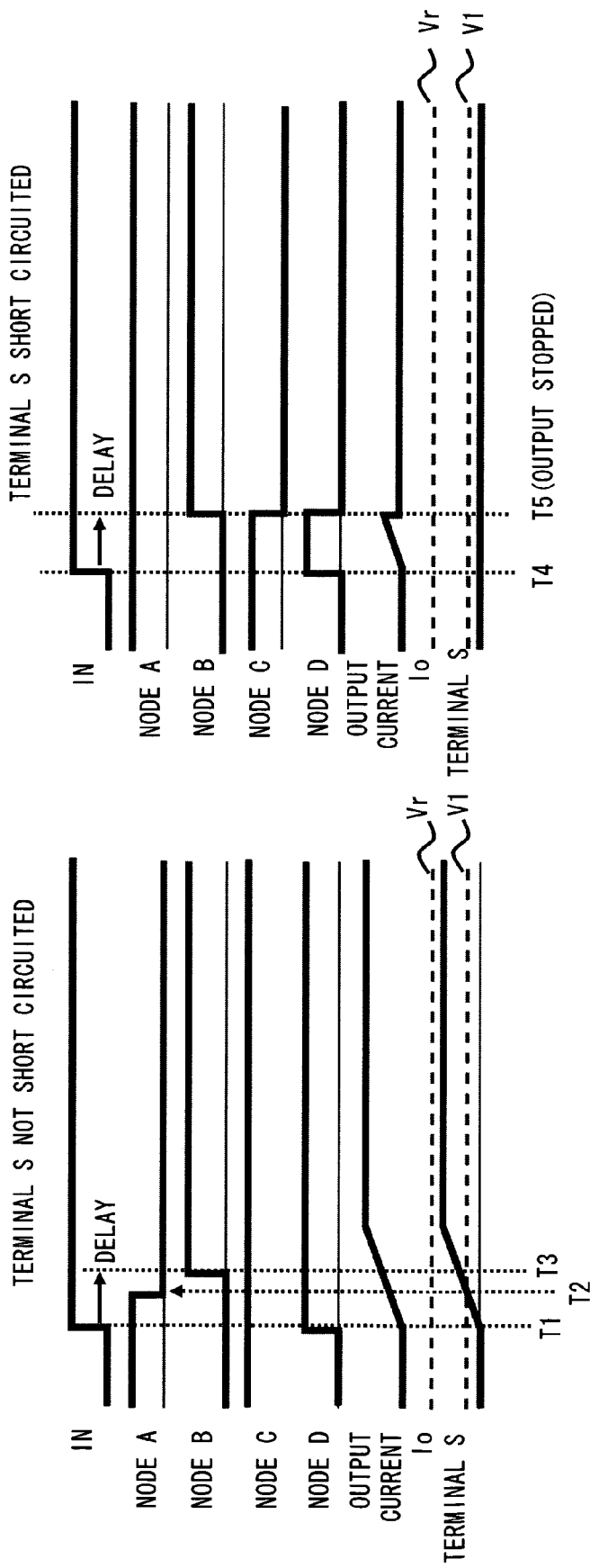
FIG. 3 is a timing chart showing a normal operation in the power switching circuit according to the first exemplary embodiment of the present invention.
FIG. 4 is a timing chart showing an abnormal operation in the power switching circuit according to the first exemplary embodiment of the present invention.

As shown in FIG. 3, in the normal condition, an enable signal (node D) rises in response to a rising edge of an input signal at the timing T1. Then, the output transistor OTr starts outputting, thereby increasing the output current Io. Moreover, in response to the increase of the output current, the detection voltage of the output current detection terminal S increases. When the detection voltage exceeds the reference voltage V1 at the timing T2, the short circuit control signal output by the comparator 26 rises and the voltage of the node A falls. After that, at the timing T3, an input signal (node B) input via the delay circuit 22 rises.

As described above, if the output current detection terminal S is not short circuited, the detection voltage exceeds the reference voltage V1 within the time in which the detection voltage is set in the delay circuit 22. Thus the detection signal of the node C maintains the high-level. Therefore, the enable signal is output while keeping the same logical level as the input signal. Further, the output transistor OTr keeps outputting the output current Io by normal operation. On the other hand, FIG. 4 shows the timing chart illustrating the operation when the output current detection terminal S is short circuited (abnormal condition) in the power switching circuit 1.

As shown in FIG. 4, in the abnormal condition, the enable signal (node D) rises in response to a rising edge of the input signal at the timing T4 and becomes enabled. Then, the output transistor OTr starts outputting, thereby increasing the output current Io. However, since the output current detection terminal S is short circuited, the detection voltage generated in the output current detection terminal S maintains the low level and does not exceed the reference voltage V1. Therefore, if the input signal (node B) input via the delay circuit 22 at the timing T5 rises, an evaluation signal (node C) falls. Further, the AND circuit 24 outputs the low level in response to a falling edge of the evaluation signal, thereby making the enable signal (node D) disabled and stopping the output transistor OTr. This prevents the output current Io from being output at the timing T5.

From the above explanation, in the power switching circuit 1 according to this embodiment, the short circuit detector 12 detects that the output current detection terminal S is short circuited by the detection voltage. Then, if the short circuit detector 12 detects that the output current detection terminal S is short circuited, the short circuit detector 12 outputs a short circuit control signal to the output controller 10. The output controller 10 stops the operation of the charge pump circuit 25 by an input of the short circuit control signal so as to stop the output transistor OTr. That is, the power switching circuit 1 according to this embodiment stops the output transistor OTr whether or not an overcurrent is generated if the output current detection terminal S is short circuited and an overcurrent cannot be detected by the detection voltage. Accordingly, this enables to prevent an overcurrent from destroying the power switching circuit 1 in advance even when an overcurrent cannot be detected.

It is noted that in this embodiment, if the output current detection terminal S is not short circuited, the overcurrent detector 13 can detect the overcurrent condition of the output transistor OTr and stop the output transistor OTr.

Second Exemplary Embodiment

Figure 5:
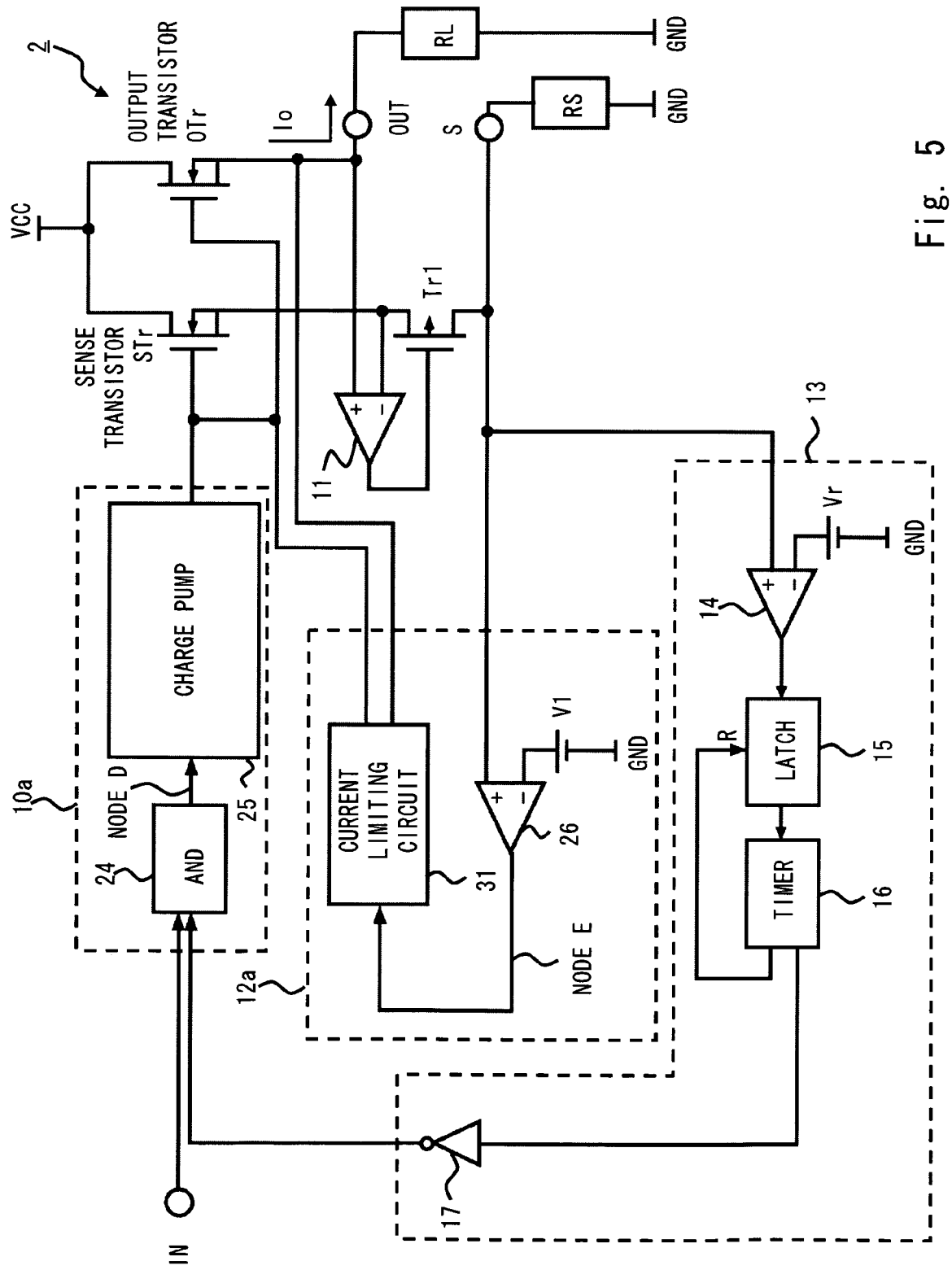
FIG. 5 is a block diagram of the power switching circuit according to a second exemplary embodiment of the present invention.

The second exemplary embodiment is another aspect of the output controller 10 and the short circuit detector 12 of the first exemplary embodiment. In the second exemplary embodiment, the power switching circuit includes an output controller 10a and a short circuit detector 12a, which have different aspects from the output controller 10 and the short circuit detector 12. The block diagram of a power switching circuit 2 according to the second exemplary embodiment is shown in FIG. 5.

The output controller 10a includes an AND circuit 24 and a charge pump circuit 25. The AND circuit 24 outputs an AND operation result of an input signal which is input from the input terminal IN and an overcurrent detection signal which is output by the overcurrent detector 13 to the charge pump circuit 25 as an enable signal. The charge pump circuit 25 outputs an output control signal according to the state of the enable signal as with the first exemplary embodiment.

The short circuit detector 12a includes a comparator 26, a second reference voltage source V1 and a current limiting circuit 31. As for the comparator 26, a non-inverting terminal is connected to the output current detection terminal S. An inverting terminal is connected to the second reference voltage source V1. The second reference voltage source V1 is connected between the ground terminal GND and the inverting terminal of the comparator 26. The second reference voltage source V1 generates the reference voltage V1 as with the first exemplary embodiment. Then, the comparator 26 outputs a comparison result of the reference voltage V1 and the detection voltage generated in the output current detection terminal S as a short circuit detection signal (node E). After that, the current limiting circuit 31 outputs a short circuit control signal which limits the output current of the output transistor OTr according to the short circuit detection signal. In the second exemplary embodiment, the short circuit control signal is formed by two signals. One short circuit control signal is connected to a gate of the output transistor OTr. Another short circuit detection signal is connected to a source of the output transistor OTr. Further, the short circuit control signal in the second exemplary embodiment keeps a potential difference between the two signals to a predetermined voltage difference so as to limit the activation level of the output transistor OTr within a predetermined range. This suppresses the current amount of the output current Io.

Figure 6:
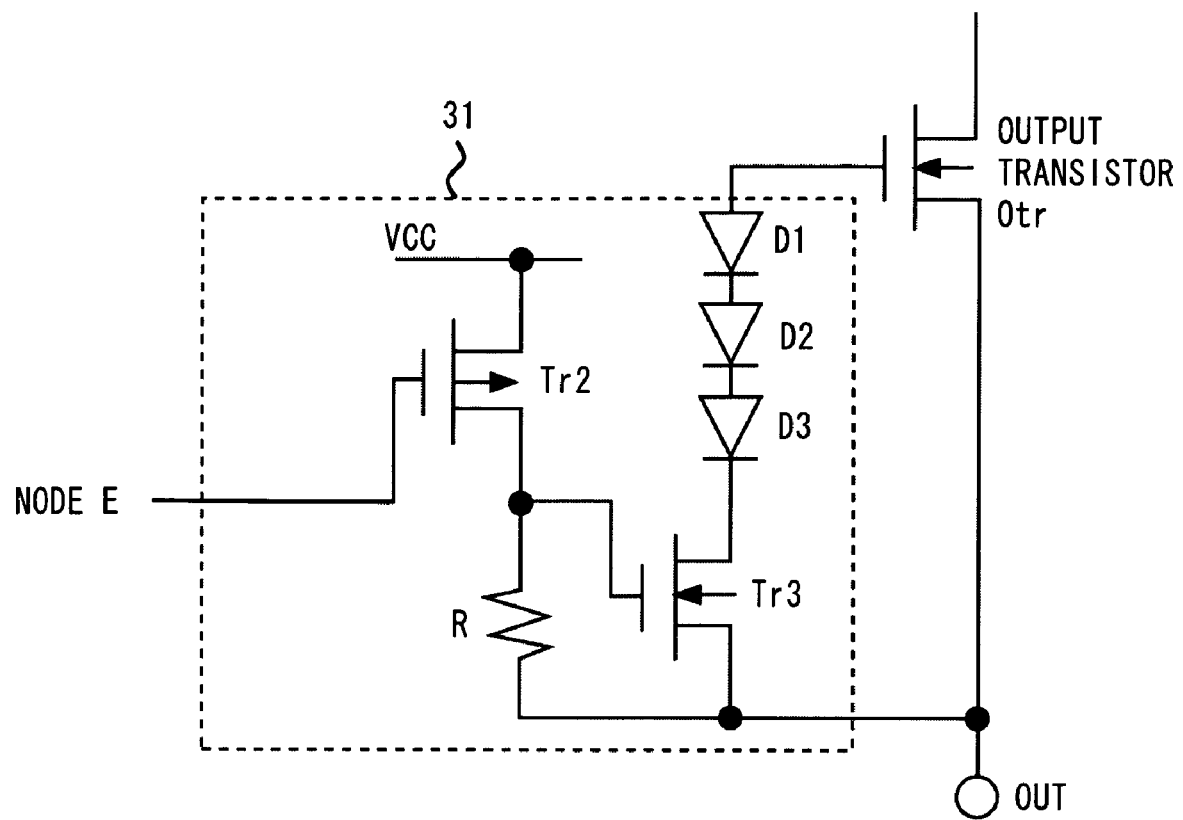
FIG. 6 is a circuit diagram of a current limiting circuit according to the second exemplary embodiment of the present invention.
Figure 12:
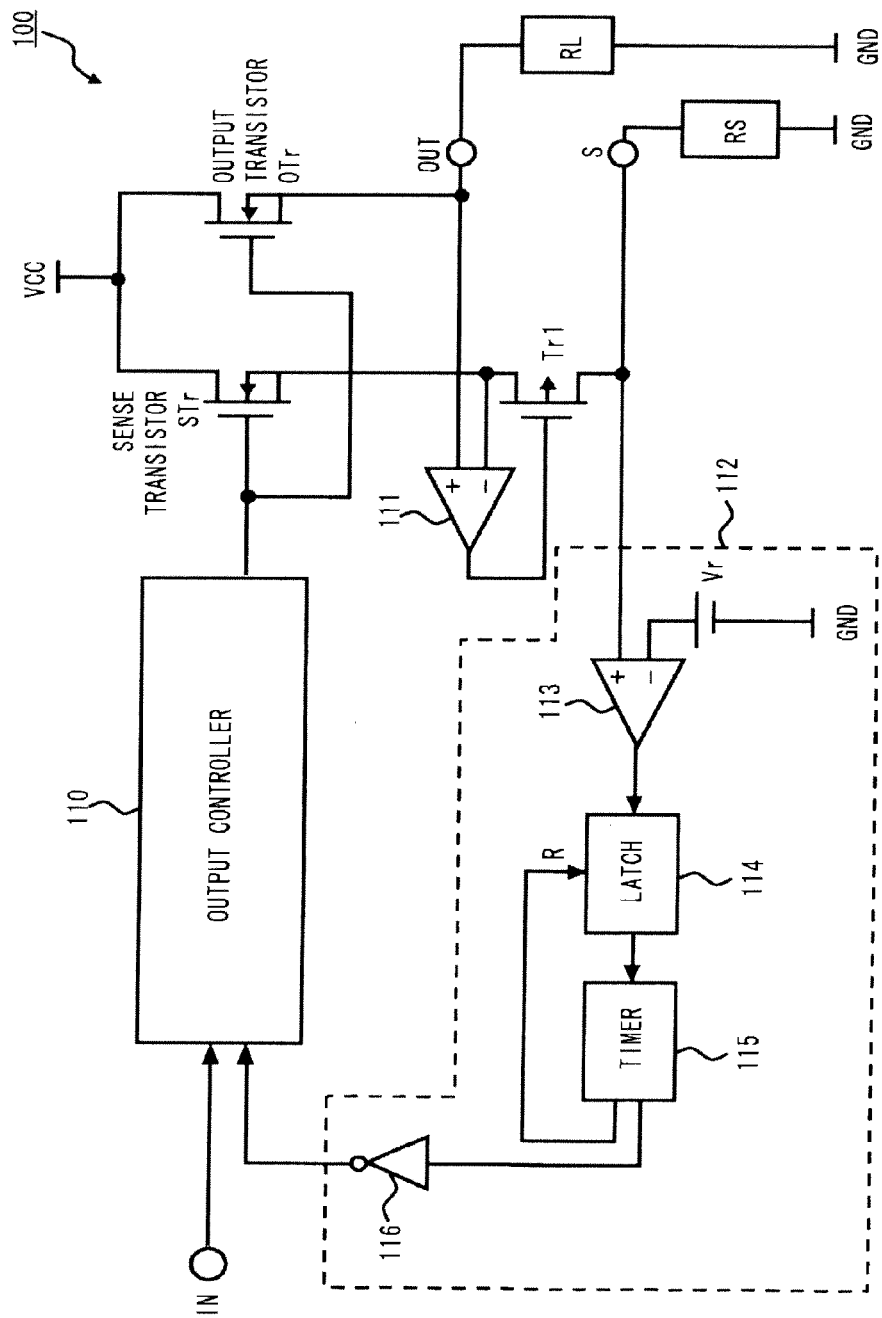
FIG. 12 is a block diagram of a power switching circuit considered from a related art.
Figures 13, 14:
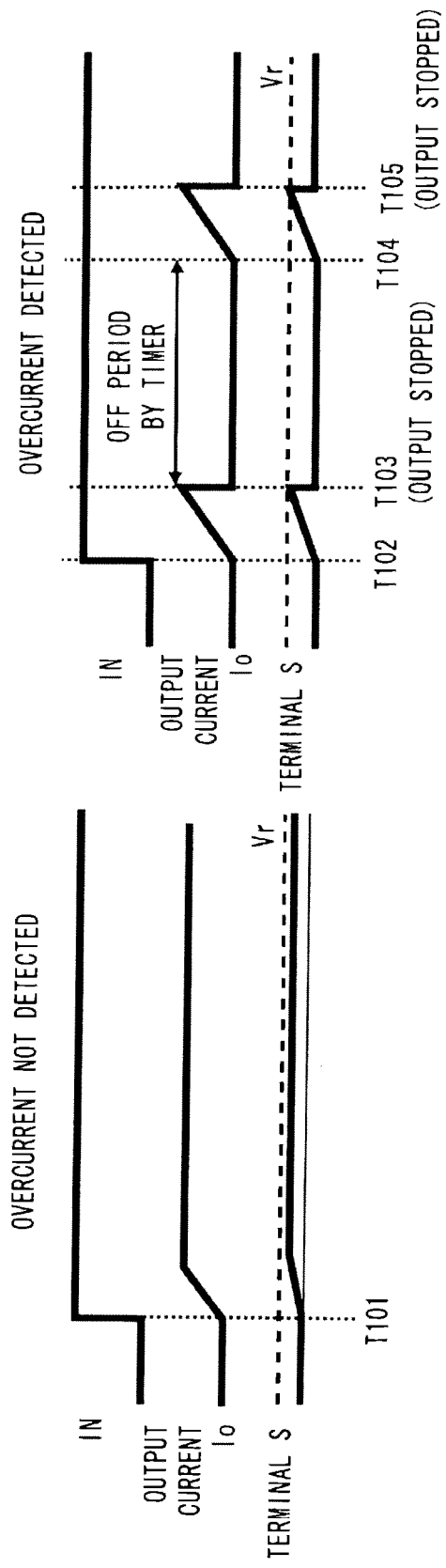
FIG. 13 is a timing chart showing a normal operation in the power switching circuit shown in FIG. 12.
FIG. 14 is a timing chart showing an operation at the time of detecting an overcurrent in the power switching circuit shown in FIG. 12.

The detailed circuit diagram of the current limiting circuit 31 is shown in FIG. 6. As shown in FIG. 6, the current limiting circuit 31 includes a control transistor Tr2, a switch transistor Tr3, a resistance R and diodes D1 to D3. The control transistor Tr2 is a PMOS transistor, for example. As for the control transistor Tr2, a source is connected to a power supply terminal VCC, a drain is connected to one end of the resistance R and a short circuit detection signal (node E) is input to a gate. The other end of the resistance R is connected to the source of the output transistor OTr. The switch transistor Tr3 is an NMOS transistor, for example. As for the switch transistor Tr3, a source is connected to the source of the output transistor OTr, a drain is connected to a cathode of the diode D3 and a gate is connected to a junction of the control transistor Tr2 and the resistance R. The diodes D1 to D3 are connected in series between the gate of the output transistor OTr and the drain of the switch transistor Tr3. In the current limiting circuit 31, a potential of an anode terminal of the diode D1 is to be the one short circuit control signal. Furthermore, a potential of the cathode terminal of the diode D3 is to be the another short circuit control signal via the switch transistor Tr3.

In current limiting circuit 31, when the short circuit detection signal indicates that a short circuit is detected (for example, low level), the control transistor Tr2 becomes ON state. Moreover, power supply voltage is applied to a gate of the switch transistor Tr3. Accordingly, since the switch transistor Tr3 is in ON state, a potential difference between the two short circuit control signals is a voltage generated by the diodes D1 to D3 (for example, three times the diode voltage).

On the other hand, in the current limiting circuit 31, when the short circuit detection signal indicates that a short circuit is not detected (for example, high-level), the control transistor Tr2 becomes OFF state. Further, the gate of the switch transistor Tr3 becomes the same voltage as the source of the switch transistor Tr3. Then the switch transistor Tr3 becomes OFF state. Thus the potential difference between the two short circuit signals is not limited by the voltage generated by the diodes D1 to D3.

Next, the operation of the power switching circuit 2 according to the second exemplary embodiment is explained. Firstly, FIG. 7 shows the timing chart illustrating an operation when the output current detection terminal S is not short circuited (normal condition) in the power switching circuit 2.

As shown in FIG. 7, in the normal condition, the output transistor OTr starts outputting in response to a rising edge of an input signal at the timing T10 and the output current Io increases. Moreover, in response to the increase of the output current, the detection voltage of the output current detection terminal S increases. After that, when the detection voltage exceeds the reference voltage V1 at the timing T11, the short circuit control signal output by the comparator 26 rises. Then the current limiting circuit 31 removes the voltage limitation between the two short circuit control signals. The output transistor OTr keeps outputting the output current Io by normal operation afterward.

On the other hand, FIG. 8 shows the timing chart illustrating the operation when the output current detection terminal S is short circuited (abnormal condition) in the power switching circuit 1. As shown in FIG. 8, in the abnormal condition, the output transistor OTr starts outputting in response to a rising edge of an input signal at the timing T12 and the output current Io increases. However, since the output current detection terminal S is short circuited, the detection voltage generated in the output current detection terminal S maintains the low level and does not exceed the reference voltage V1. Therefore, the short circuit detection signal (node E) maintains the low level. Furthermore, the current limiting circuit 31 limits the voltage difference between the two current control signals. Moreover, the voltage limitation between the gate and the source of the output transistor OTr is maintained by the current limiting circuit 31. Then, at the timing T13, when reaching the limit value of the output current Io in which the output transistor OTr can pass by the limited voltage between the gate and the source, the output current Io maintains the current value thereafter.

From the above explanation, the power switching circuit 2 according to the second exemplary embodiment limits the output current Io within the predetermined limit value when the output current detection terminal S is short circuited. Accordingly, if the consumption current in the normal condition by the load RL is within the range of the output current Io, it is possible to continue using the power switching circuit 2 even when the output current detection terminal S is short circuited. Moreover, as the activation level of the output transistor OTr is limited within the predetermined range by the short circuit control signal, the overcurrent of the output transistor OTr can also be prevented.

Third Exemplary Embodiment

Figure 9:
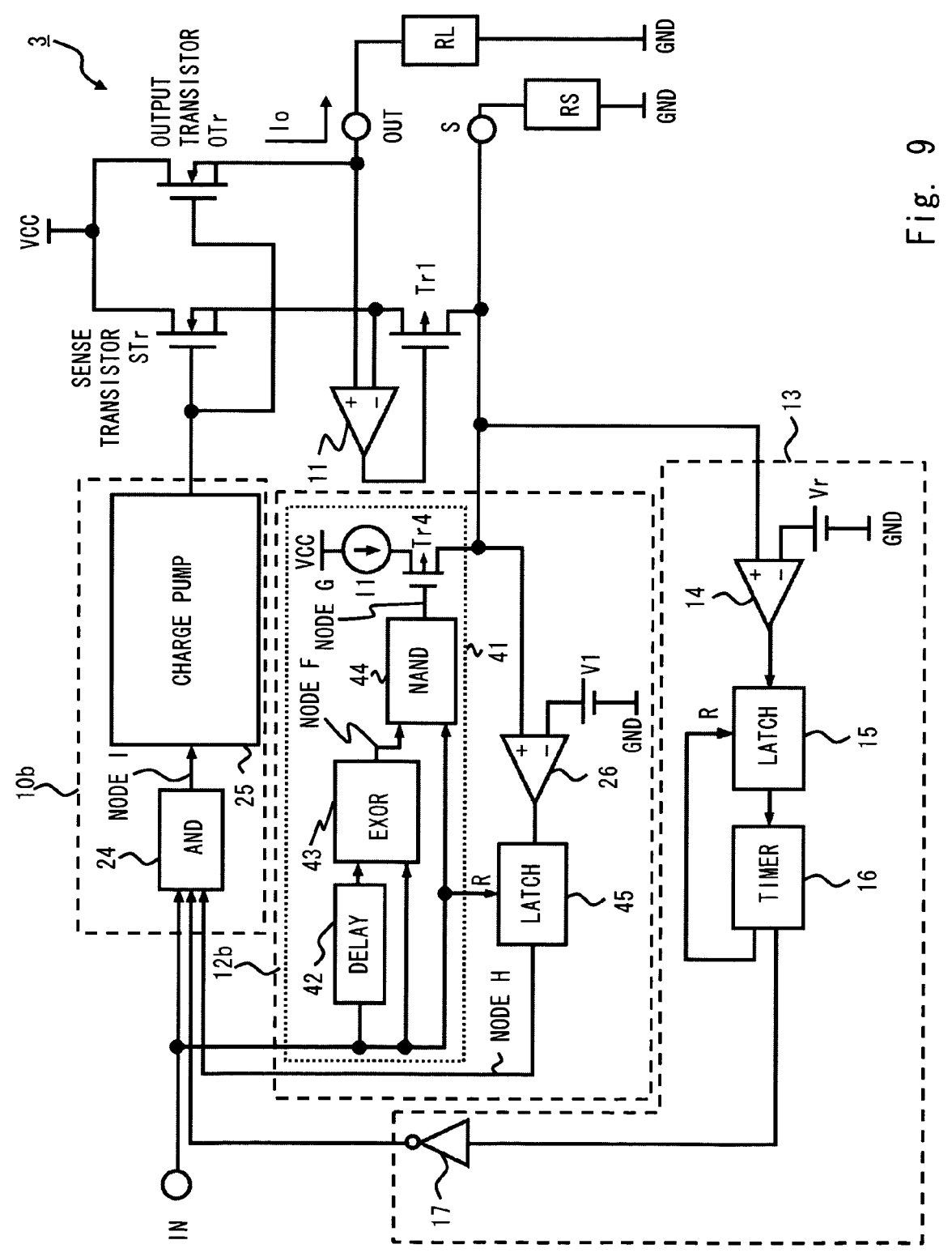

The third exemplary embodiment shows another aspect of the output controller 10 and the short circuit detector 12 of the first exemplary embodiment. In the third exemplary embodiment, a power switching circuit includes an output controller 10b and a short circuit detector 12b which have different aspects from the output controller 10 and the short circuit detector 12. The block diagram of a power switching circuit 3 according to the third exemplary embodiment is shown in FIG. 9.

The output controller 10b includes an AND circuit 24 and a charge pump circuit 25. The AND circuit 24 outputs an AND operation result of an input signal which is input from the input terminal IN, an overcurrent detection signal which is output by the overcurrent detector 13 and a short circuit control signal (node H) which is output by the short circuit detector 12b to the charge pump circuit 25 as an enable signal. The charge pump circuit 25 outputs an output control signal according to the state of the enable signal as with the first exemplary embodiment.

The short circuit detector 12b includes a comparator 26, a second reference voltage source V1, a one shot pulse current generator 41 and a latch circuit 45. As for the comparator 26, a non-inverting terminal is connected to the output current detection terminal S. An inverting terminal is connected to the second reference voltage source V1. The second reference voltage source V1 is connected between the ground terminal GND and the inverting terminal of the comparator 26. The second reference voltage source V1 generates a reference voltage V1 as with the first exemplary embodiment. Then, the comparator 26 outputs the comparison result of the reference voltage V1 and the detection voltage generated in the output current detection terminal S via the latch circuit 45 as a short circuit control signal (node H). It is noted that in this embodiment, an input signal is provided to the latch circuit 45 as a reset signal. That is, once the comparator 26 sets a short circuit control signal to a high level, the latch circuit 45 keeps the high level until the power switching circuit 3 starts the operation of the next period.

After the input signal input via the input terminal IN rises, the one shot pulse current generator 41 outputs a one shot pulse current which is output for a predetermined period to the output current detection terminal S. The one shot pulse current generator 41 includes a delay circuit 42, an EXOR circuit 43, a NAND circuit 44, a current source I1 and a PMOS transistor Tr4.

The delay circuit 42 delays an input signal input via the input terminal IN and outputs the input signal. The EXOR circuit 43 outputs an EXOR operation result of the input signal which is input from the input terminal IN and the input signal input via the delay circuit 42. The NAND circuit 44 outputs a NAND operation result of the input signal which is input from the input terminal IN and the EXOR operation result of the EXOR circuit 43. As for the PMOS transistor Tr4, an output of the NAND circuit 44 is connected to a gate, the current source I1 is connected to a source and a drain is connected to the output current detection terminal S. The current source I1 is connected between the source of the PMOS transistor Tr4 and the power supply terminal VCC.

In the one shot pulse current generator 41, the NAND circuit 44 outputs a one shot pulse signal having the pulse width equivalent to the delay time which is set in the delay circuit 42. After that, the one shot pulse current generator 41 turns on the PMOS transistor for the period equivalent to the pulse width by the one shot pulse signal. Then the one shot pulse current generator 41 outputs a current form the current source I1 to the output current detection terminal S only for the period equivalent to the delay time which is set in the delay circuit 42. The current output to the output current detection terminal S at this time is referred to as a one shot pulse current.

Subsequently, the operation of the power switching circuit 3 according to the third exemplary embodiment is explained. Firstly, the timing chart showing the operation in the state when the output current detection terminal S is not short circuited in the power switching circuit 3 (normal condition) is illustrated in FIG. 10.

As shown in FIG. 10, in the normal condition, an output signal (node F) of the EXOR circuit 43 rises in response to a rising edge of the input signal at the timing T20. Then, the output signal (node G) of the NAND circuit 44 falls in response to a rising edge of the output signal of the EXOR circuit 43. Accordingly, the PMOS transistor Tr4 becomes ON state. Furthermore, the one shot pulse current is output from the current source I1 to the output current detection terminal S. Then, the detection voltage of the output current detection terminal S rises in response to the one shot pulse current and exceeds the reference voltage V1. Accordingly, the short circuit control signal (node H) and an enable signal (node I) rise. Therefore, the output transistor OTr starts outputting the output current Io from the timing T20.

At the timing T21, the output signal (node G) of the EXOR circuit 43 falls. The output signal (node F) of the NAND circuit 44 rises in response to a falling edge of the output signal of the EXOR circuit 43. Accordingly, the PMOS transistor Tr4 becomes OFF state. Furthermore, the one shot pulse current stops. The latch circuit 45 holds the short circuit control signal at this time. Thus the short circuit control signal maintains the high level and the output transistor OTr keeps outputting the output current Io.

On the other hand, FIG. 11 shows the timing chart illustrating the operation when the output current detection terminal S is short circuited (abnormal condition) in the power switching circuit 3. As shown in FIG. 11, in the abnormal condition, the output signal (node F) of the EXOR circuit 43 rises in response to a rising edge of the input signal at the timing T22. Then, the output signal (node G) of the NAND circuit 44 falls in response to a rising edge of the output signal of the EXOR circuit 43. Accordingly, the PMOS transistor Tr4 becomes ON state. Furthermore, the one shot pulse current is output from the current source I1 to the output current detection terminal S. However, as the output current detection terminal S is short circuited, the detection voltage of the output current detection terminal S maintains the low level and does not exceed the reference voltage V1. Therefore, the short circuit control signal (node H) and an enable signal (node I) maintain the low level. Thus the output current Io by the output transistor OTr is maintained an off state.

At the timing T23, the output signal (node F) of the EXOR circuit 43 falls. The output signal (node G) of the NAND circuit 44 rises in response to a falling edge of the output signal of the EXOR circuit 43. Then the PMOS transistor Tr4 becomes OFF state. Furthermore the one shot pulse current stops. The short circuit control signal and the enable signal are low level at this time. Thus the output current Io by the output transistor OTr keeps the off state even after the timing T23.

From the abovementioned explanation, the power switching circuit 3 according to the third exemplary embodiment confirms the short circuit condition of the output current detection terminal S at the timing of start outputting the output current Io. If a short circuit is found in the output current detection terminal S as a result of the confirmation, the power switching circuit 3 does not output the output current Io but maintains the off state of the output transistor OTr. Therefore, the power switching circuit 3 according to the third exemplary embodiment enables to improve the protection capability against the short circuit condition of the output current detection terminal S better than the first and the second exemplary embodiments. Moreover, as the output current Io does not flow at any time when the output current detection terminal S is short circuited, it is possible to save the power consumption of the power switching circuit 3 after the short circuit is generated.

The first to third exemplary embodiments can be combined as desirable by one of ordinary skill in the art. For example, the logical circuit (inverter and AND circuit etc.) for detecting a short circuit or an overcurrent can be modified appropriately according to the system.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A power switching circuit comprising:
   an output transistor connected between a power supply terminal and an output terminal;
   an output controller which controls a conducting state of the output transistor according to an input signal, wherein the output controller comprises a delay circuit which delays the input signal, a NAND circuit which outputs a NAND operation result of a short circuit control signal and the input signal input via the delay circuit as an evaluation signal, an AND circuit which outputs an AND operation result of the evaluation signal and the input signal as an enable signal and a charge pump circuit which outputs an output control signal for controlling a conducting state of the output transistor according to the enable signal;
   a sense transistor having a gate commonly connected to the output transistor, which detects an output current flowing into the output transistor;
   an output current detection terminal in which a detection voltage corresponding to the output current is generated;
   a short circuit detector which detects a short circuit condition of the output current detection terminal according to the detection voltage and outputs a short circuit control signal for stopping the output transistor or limiting the output current, wherein the short circuit detector includes a comparator which compares the detection voltage and a first reference voltage and outputs a comparison result as the short circuit control signal; and
   the output controller cuts off the output transistor irrespective of the input signal if the short circuit control signal indicates that a short circuit is detected.

2. The power switching circuit according to claim 1, further comprising:
   an overcurrent detector which detects an overcurrent condition of the output transistor according to a comparison result of the detection voltage and a second reference voltage and outputs an overcurrent detection signal,
   wherein the output controller cuts off the output transistor irrespective of the input signal if the overcurrent detection signal indicates that an overcurrent is detected.

3. The power switching circuit according to claim 1, wherein the comparator of the short circuit detector compares the detection voltage and the first reference voltage and outputs a comparison result as a short circuit detection signal; and
   wherein the short circuit detector further comprises a current limiting circuit which outputs the short circuit control signal according to the short circuit detection signal and limits a voltage between a gate and a source of the output transistor to a predetermined voltage.

4. The power switching circuit according to claim 3, wherein the current limiting circuit comprises:
   at least one diode which is connected between the gate and the source of the output transistor, and
   a switch transistor which controls a current flowing into the diode according to the short circuit detection signal,
   wherein the predetermined voltage is equivalent to a voltage generated by the diode.

5. A power switching circuit comprising:
   an output transistor connected between a power supply terminal and an output terminal;
   an output controller which controls a conducting state of the output transistor according to an input signal;
   a sense transistor having a gate commonly connected to the output transistor, which detects an output current flowing into the output transistor;
   an output current detection terminal in which a detection voltage corresponding to the output current is generated; and a short circuit detector which detects a short circuit condition of the output current detection terminal according to the detection voltage and outputs a short circuit control signal for stopping the output transistor or limiting the output current, wherein the short circuit detector comprises:

a one shot pulse current output section which outputs a one shot pulse current flowing into the output current detection terminal for a predetermined period from when the output transistor is started to operate; and a comparator which compares a fluctuation range of the detection voltage by the one shot pulse current and a second reference voltage and outputs a comparison result as the short circuit control signal, wherein the one shot pulse current output section comprises:

a delay circuit which delays the input signal and outputs a delayed input signal;

an EXOR circuit which outputs an EXOR operation result of the delayed input signal and the input signal as an evaluation signal;

a NAND circuit which outputs a NAND operation result of the evaluation signal and the input signal as a one shot pulse signal; and the predetermined period is equivalent to a pulse width of the one shot pulse signal, and wherein the output controller cuts off the output transistor irrespective of the input signal if the short circuit control signal indicates that a short circuit is detected.

6. The power switching circuit according to claim 5, wherein the short circuit detector comprises a latch circuit which is mounted between the comparator and the output controller and holds a value of the short circuit control signal.

7. The power switching circuit according to claim 5, wherein the one shot pulse current output section comprises a delay circuit which delays the input signal, and the predetermined period is equivalent to delay time in the delay circuit.

8. A power switching circuit comprising:

an output transistor connected between a power supply terminal and an output terminal;

an output controller controlling a conducting state of the output transistor according to an input signal;

a sense transistor having a gate commonly connected to the output transistor, which detects an output current flowing into the output transistor;

an output current detection terminal at which a detection voltage corresponding to the output current is generated, the output current detection terminal being coupled with a ground terminal via a sense resistor;

a short circuit detector detecting a short circuit condition of the sense resistor according to a comparison result of the detection voltage and a first reference voltage and outputting a short circuit control signal; and an overcurrent detector detecting an overcurrent condition of the output transistor according to a comparison result of the detection voltage and a second reference voltage and outputting an overcurrent detection signal, the second reference voltage being set in higher voltage than the first reference voltage, wherein the output current is cut off or limited irrespectively of the input signal in response to the short circuit control signal indicating a short circuit of the sense resistor, and wherein the output current is cut off irrespectively of the input signal caused by the overcurrent detection signal indicating an overcurrent flowing through the output transistor.

9. The power switching circuit according to claim 8, wherein the short circuit detector comprises:

a first comparator having an inverting terminal connected to the first reference voltage, a non-inverting terminal connected to the output current detection terminal, and an output terminal outputting the short circuit control signal.

10. The power switching circuit according to claim 9, wherein the short circuit detector further comprises:

a latch circuit provided between the first comparator and the output controller and holds a value of the short circuit control signal.

11. The power switching circuit according to claim 10, wherein the short circuit detector further comprises:

a one shot pulse current output section outputting a one shot pulse current flowing into the output short circuit detection terminal and the non-inverting terminal of the first comparator for a predetermined period from when the output transistor is started to operate.

12. The power switching circuit according to claim 11, wherein the one shot pulse current output section comprises:

a delay circuit delaying the input signal and outputting a delayed input signal;

an EXOR circuit outputting an EXOR operation result of the delayed input signal and the input signal as an evaluation signal; and a NAND circuit outputting a NAND operation result of the evaluation signal and the input signal as a one shot pulse signal, wherein the predetermined period is equivalent to a pulse width of the one shot pulse signal, and the output controller cuts off the output transistor irrespective of the input signal if the short circuit control signal indicates that a short circuit is detected.

13. The power switching circuit according to claim 9, wherein the short circuit detector further comprises:

a current limiting circuit limiting a voltage between a gate and a source of the output transistor to a predetermined voltage in response to the short circuit control signal indicating a short circuit of the sense resistor.

14. The power switching circuit according to claim 13, wherein the short circuit detector further comprises:

at least one diode connected between the gate and the source of the output transistor, and a switch transistor which controls a current flowing into the diode according to the short circuit detection signal, wherein the predetermined voltage is equivalent to a voltage generated by the diode.

15. The power switching circuit according to claim 8, wherein the overcurrent detector comprises:

a second comparator having an inverting terminal connected to the second reference voltage, a non-inverting terminal connected to the output current detection terminal, and an output terminal outputting the comparison result;

a latch circuit receiving and holding the comparison result to output the overcurrent detection signal and resetting the comparison result by a reset signal.

16. The power switching circuit according to claim 8, wherein the output controller comprises:

a delay circuit which delays the input signal;

a NAND circuit which outputs a NAND operation result of the short circuit control signal and the input signal input via the delay circuit as an evaluation signal;

an AND circuit which outputs an AND operation result of the evaluation signal and the input signal as an enable signal; and a charge pump circuit which outputs an output control signal for controlling a conducting state of the output transistor according to the enable signal.

* * * * *